US009696991B1

(12) United States Patent
Langhammer et al.

(10) Patent No.: US 9,696,991 B1
(45) Date of Patent: Jul. 4, 2017

(54) FIXED-POINT AND FLOATING-POINT OPTIMIZATION

(71) Applicant: ALTERA CORPORATION, San Jose, CA (US)

(72) Inventors: Martin Langhammer, Salisbury (GB); Tomasz S. Czajkowski, Toronto (CA)

(73) Assignee: Altera Corporation, San Jose, CA (US)

( * ) Notice: Subject to any disclaimer, the term of this patent is extended or adjusted under 35 U.S.C. 154(b) by 121 days.

(21) Appl. No.: 13/727,835

(22) Filed: Dec. 27, 2012

(51) Int. Cl.
*G06F 17/50* (2006.01)
*G06F 9/30* (2006.01)
(52) U.S. Cl.
CPC .................................. *G06F 9/3001* (2013.01)
(58) Field of Classification Search
USPC ........................................................ 716/116
See application file for complete search history.

(56) References Cited

U.S. PATENT DOCUMENTS

| 6,408,422 | B1* | 6/2002 | Hwang et al. ................ 716/116 |
| 7,813,912 | B1* | 10/2010 | Sundararajan ...... G06F 17/5022 703/22 |
| 7,865,541 | B1 | 1/2011 | Langhammer |
| 2007/0088537 | A1* | 4/2007 | Lertora et al. .................. 703/28 |
| 2008/0275931 | A1* | 11/2008 | Schmookler ................. 708/501 |
| 2011/0320513 | A1 | 12/2011 | Langhammer |

OTHER PUBLICATIONS

OpenCL—The Standard for Parallel Programming of Heterogeneous Systems, Khronos Group.
U.S. Appl. No. 13/234,419, filed Sep. 16, 2011, Martin Langhammer.

* cited by examiner

*Primary Examiner* — Eric Lee
(74) *Attorney, Agent, or Firm* — Fletcher Yoder, P.C.

(57) ABSTRACT

Systems and methods for enhancing fixed-point operations, floating-point operations, or a combination thereof for programs implemented on an integrated circuit (IC) are provided. Portions of these operations may be shared among the operations. Accordingly, the embodiments described herein enhance these fixed-point operations, floating-point operations, or a combination thereof based upon these portions of the operations that may be shared.

18 Claims, 6 Drawing Sheets

US 9,696,991 B1

FIXED-POINT AND FLOATING-POINT OPTIMIZATION

BACKGROUND

The present disclosure relates generally to integrated circuits, such as field programmable gate arrays (FPGAs). More particularly, the present disclosure relates to optimizing fixed-point and floating-point operations implemented on integrated circuit (e.g., an FPGA).

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Integrated circuits (ICs) take a variety of forms. For instance, field programmable gate arrays (FPGAs) are integrated circuits that are intended as relatively general-purpose devices. FPGAs may include logic that may be programmed (e.g., configured) after manufacturing to provide any desired functionality that the FPGA is designed to support. Thus, FPGAs contain programmable logic, or logic blocks, that may be configured to perform a variety of functions on the FPGAs, according to a designer's design. Additionally, FPGAs may include input/output (I/O) logic, as well as high-speed communication circuitry. For instance, the high-speed communication circuitry may support various communication protocols and may include high-speed transceiver channels through which the FPGA may transmit serial data to and/or receive serial data from circuitry that is external to the FPGA.

In ICs such as FPGAs, the programmable logic is typically configured using low level programming languages such as VHDL or Verilog. Unfortunately, these low level programming languages may provide a low level of abstraction and, thus, may provide a development barrier for programmable logic designers. Higher level programming languages, such as OpenCL have become useful for enabling more ease in programmable logic design. The higher level programs are used to generate code corresponding to the low level programming languages. Kernels may be useful to bridge the low level programming languages into executable instructions that may be performed by the integrated circuits. Accordingly, OpenCL programs typically require at least a single hardware implementation for each kernel in the OpenCL program. In many cases, kernels may include fixed-point and/or floating-point operations. Unfortunately, these fixed-point and/or floating-point operations may consume considerable area on an IC. In some cases, a kernel with fixed-point and/or floating-point operations may consume thousands of logic elements of the IC. When the IC is small (e.g., has a limited number of logical elements available), the functionality that may be implemented on the IC or the number of times a kernel may be replicated may be limited. Accordingly, the throughput of the implementation may be adversely affected.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

Present embodiments relate to systems, methods, and devices for enhancing performance of machine-implemented programs through enhanced fixed-point and/or floating-point operations. In particular, the present embodiments may provide enhanced fixed-point and/or floating-point operations that take advantage of shared sub-functions within these fixed-point and/or floating-point operations. For example, in some embodiments, sub-functions may be decomposed and shared, such that logical elements of the IC that may be needed to implement fixed-point and/or floating-point operations may be reduced. Additionally, in some embodiments, specific fixed-point and/or floating-point sub-libraries with commonly used sub-functions may be generated and provided on the IC. Further, in some embodiments, range-reduction may reduce the amount of logical elements needed to implement fixed-point and/or floating-point operations.

Various refinements of the features noted above may exist in relation to various aspects of the present disclosure. Further features may also be incorporated in these various aspects as well. These refinements and additional features may exist individually or in any combination. For instance, various features discussed below in relation to one or more of the illustrated embodiments may be incorporated into any of the above-described aspects of the present invention alone or in any combination. Again, the brief summary presented above is intended only to familiarize the reader with certain aspects and contexts of embodiments of the present disclosure without limitation to the claimed subject matter.

BRIEF DESCRIPTION OF THE DRAWINGS

Various aspects of this disclosure may be better understood upon reading the following detailed description and upon reference to the drawings in which.

DETAILED DESCRIPTION OF SPECIFIC EMBODIMENTS

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

As discussed in further detail below, embodiments of the present disclosure relate generally to circuitry for enhancing performance of machine-readable programs implemented on an integrated circuit (IC). In particular, sharing portions of fixed-point and/or floating-point operations among several of these operations may be used to enhance performance of a machine-implemented program executed on the IC (e.g., decrease a programmable logic area occupied by the fixed-point and/or floating-point operations). In certain embodiments, computer-implemented mathematical declarations, such as a math.h header file, may define shareable sub-functions that are commonly used in higher-level functions. Additionally, in some embodiments, specific sub-functions may be derived that, while potentially larger than the most optimal implementation of the sub-function, may be, in an overall sense, more efficient because they may be shared across many other functions. Further, in certain embodiments, when a set of functions use polynomial approximation, a polynomial approximation circuit may be designed that can support all of the set of functions, providing coefficients for the polynomial selected for a specific function in the set of functions. Each of the techniques described herein may be implemented independently or in combination with one another.

Figure 1:
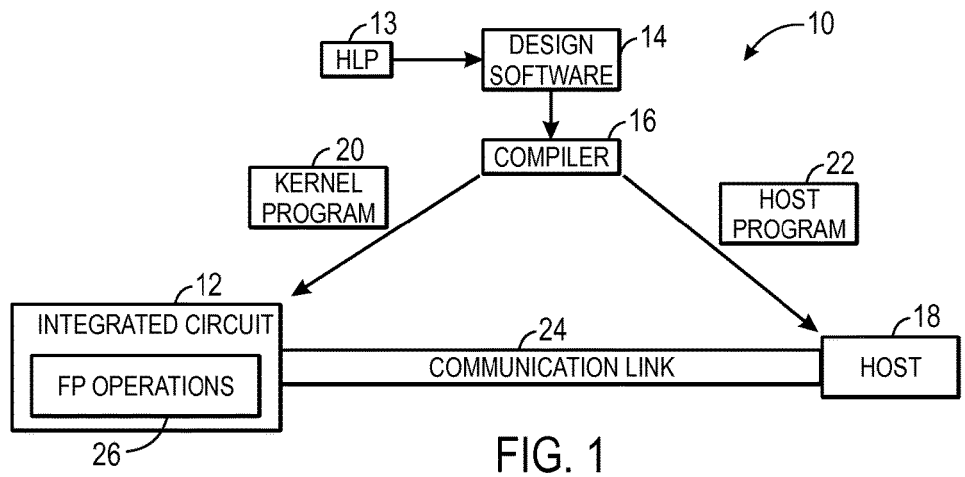
FIG. 1 is a block diagram of a system that utilizes enhanced fixed-point and/or floating-point operations, in accordance with an embodiment.

With the foregoing in mind, FIG. 1 illustrates a block diagram of a system 10 that includes fixed-point and/or floating-point operations that may reduce a logical area that is typically needed for such an implementation. As discussed above, a designer may desire to implement functionality on an integrated circuit 12 (IC, such as a field programmable gate array (FPGA)). The designer may specify a high level program 13 to be implemented, such as an OpenCL program, which may enable the designer to more efficiently and easily provide programming instructions to implement a set of programmable logic for the IC 12 without requiring specific knowledge of low level computer programming languages (e.g., Verilog or VHDL). For example, because OpenCL is quite similar to other high level programming languages, such as C++, designers of programmable logic familiar with such programming languages may have a reduced learning curve than designers that are required to learn unfamiliar low level programming languages to implement new functionalities in the IC.

The designers may implement their high level designs using design software 14, such as a version of Quartus by Altera™. The design software 14 may use a compiler 16 to convert the high level program into a low level program. The compiler 16 may provide machine-readable instructions representative of the high level program to a host 18 and the IC 12. For example, the IC 12 may receive one or more kernel programs 20 which describe the hardware implementations that should be stored in the IC. The host 18 may receive a host program 22 which may be implemented by the kernel programs 20. To implement the host program 22, the host 18 may communicate instructions from the host program 22 to the IC 12 via a communications link 24, which may be, for example, direct memory access (DMA) communications or peripheral component interconnect express (PCIe) communications. In some embodiments, enhanced fixed-point and/or floating-point operations 26 may be implemented on the integrated circuit 12. As will be described in more detail below, portions of the fixed-point and/or floating-point operations 26 may be shared, resulting in implementation efficiencies.

Figure 2:
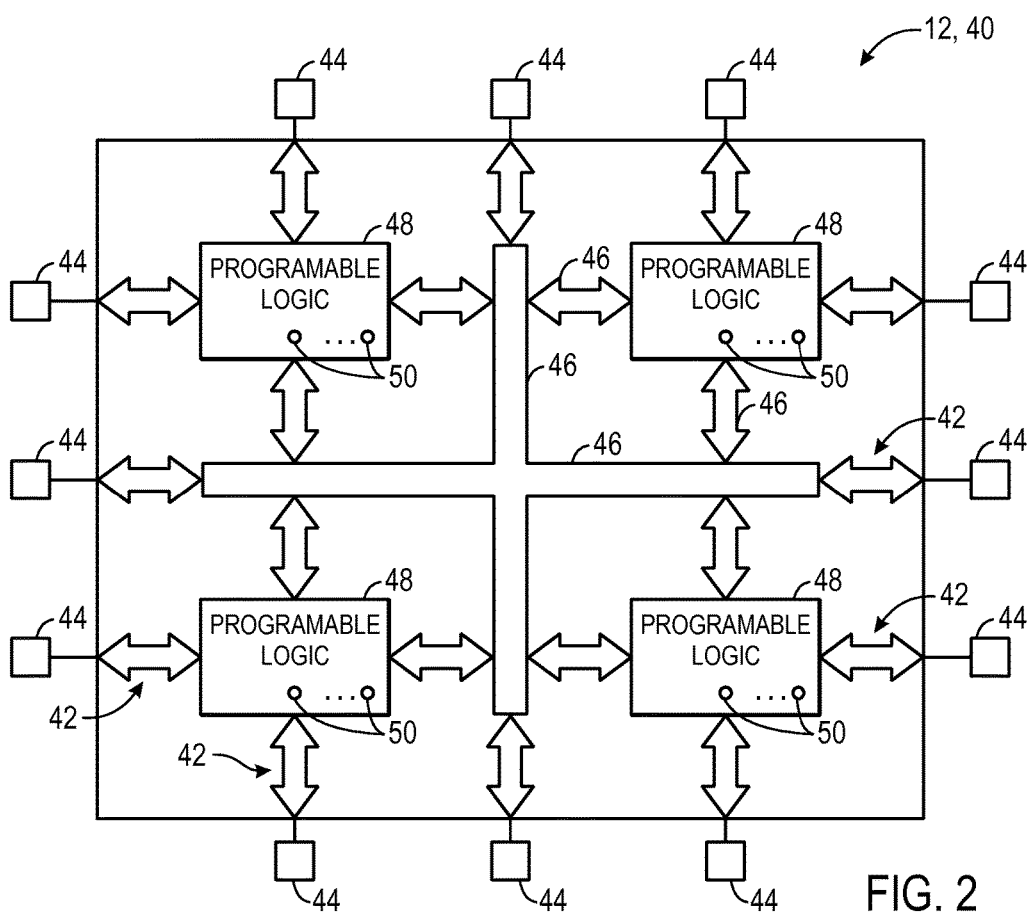
FIG. 2 is a block diagram of a programmable logic device that may include logic useful for implementing the enhanced fixed-point and/or floating-point operations of FIG. 1, in accordance with an embodiment.

Turning now to a more detailed discussion of the IC 12, FIG. 2 illustrates an IC device 12, which may be a programmable logic device, such as a field programmable gate array (FPGA) 40. For the purposes of this example, the device 40 is referred to as an FPGA, though it should be understood that the device may be any type of programmable logic device (e.g., an application-specific integrated circuit and/or application-specific standard product). As shown, FPGA 40 may have input/output circuitry 42 for driving signals off of device 40 and for receiving signals from other devices via input/output pins 44. Interconnection resources 46, such as global and local vertical and horizontal conductive lines and buses, may be used to route signals on device 40. Additionally, interconnection resources 46 may include fixed interconnects (conductive lines) and programmable interconnects (i.e., programmable connections between respective fixed interconnects). Programmable logic 48 may include combinational and sequential logic circuitry. For example, programmable logic 48 may include look-up tables, registers, and multiplexers. In various embodiments, the programmable logic 48 may be configured to perform a custom logic function. The programmable interconnects associated with interconnection resources may be considered to be a part of programmable logic 48. As discussed in further detail below, the FPGA 40 may include adaptable logic that enables partial reconfiguration of the FPGA 40, such that kernels may be added, removed, and/or swapped during the runtime of the FPGA 40.

Programmable logic devices, such as FPGA 40, may contain programmable elements 50 with the programmable logic 48. For example, as discussed above, a designer (e.g., a customer) may program (e.g., configure) the programmable logic 48 to perform one or more desired functions. By way of example, some programmable logic devices may be programmed by configuring their programmable elements 50 using mask programming arrangements, which is performed during semiconductor manufacturing. Other programmable logic devices are configured after semiconductor fabrication operations have been completed, such as by using electrical programming or laser programming to program their programmable elements 50. In general, programmable elements 50 may be based on any suitable programmable technology, such as fuses, antifuses, electrically-programmable read-only-memory technology, random-access memory cells, mask-programmed elements, and so forth.

Most programmable logic devices are electrically programmed. With electrical programming arrangements, the programmable elements 50 may be formed from one or more memory cells. For example, during programming, configuration data is loaded into the memory cells 50 using pins 44 and input/output circuitry 42. In one embodiment, the memory cells 50 may be implemented as random-access-memory (RAM) cells. The use of memory cells 50 based on RAM technology is described herein is intended to be only one example. Further, because these RAM cells are loaded with configuration data during programming, they are sometimes referred to as configuration RAM cells (CRAM). These memory cells 50 may each provide a corresponding static control output signal that controls the state of an associated logic component in programmable logic 48. For instance, in some embodiments, the output signals may be applied to the gates of metal-oxide-semiconductor (MOS) transistors within the programmable logic 48.

The circuitry of FPGA 40 may be organized using any suitable architecture. As an example, the logic of FPGA 40 may be organized in a series of rows and columns of larger programmable logic regions, each of which may contain multiple smaller logic regions. The logic resources of FPGA 40 may be interconnected by interconnection resources 46 such as associated vertical and horizontal conductors. For example, in some embodiments, these conductors may include global conductive lines that span substantially all of FPGA 40, fractional lines such as half-lines or quarter lines that span part of device 40, staggered lines of a particular length (e.g., sufficient to interconnect several logic areas), smaller local lines, or any other suitable interconnection resource arrangement. Moreover, in further embodiments, the logic of FPGA 40 may be arranged in more levels or layers in which multiple large regions are interconnected to form still larger portions of logic. Still further, other device arrangements may use logic that is not arranged in a manner other than rows and columns.

As discussed above, the FPGA 40 may allow a designer to create a customized design capable of executing and performing customized functionalities. Each design may have its own hardware implementation to be implemented on the FPGA 40. These hardware implementations may include fixed-point and/or floating-point operations, which may take up a significant amount of the available programmable elements 50. Accordingly, in some instances, it may be desirable to enhance the program by reducing the amount of programmable elements 50 needed to implement these functions in the FPGA 40. This may be done by sharing sub-functions, creating a shared functions library that may be accessed by fixed-point and/or floating-point operations, and/or sharing series functions among fixed-point and/or floating-point operations. These efficiencies will be described in more detail below.

Figure 3:
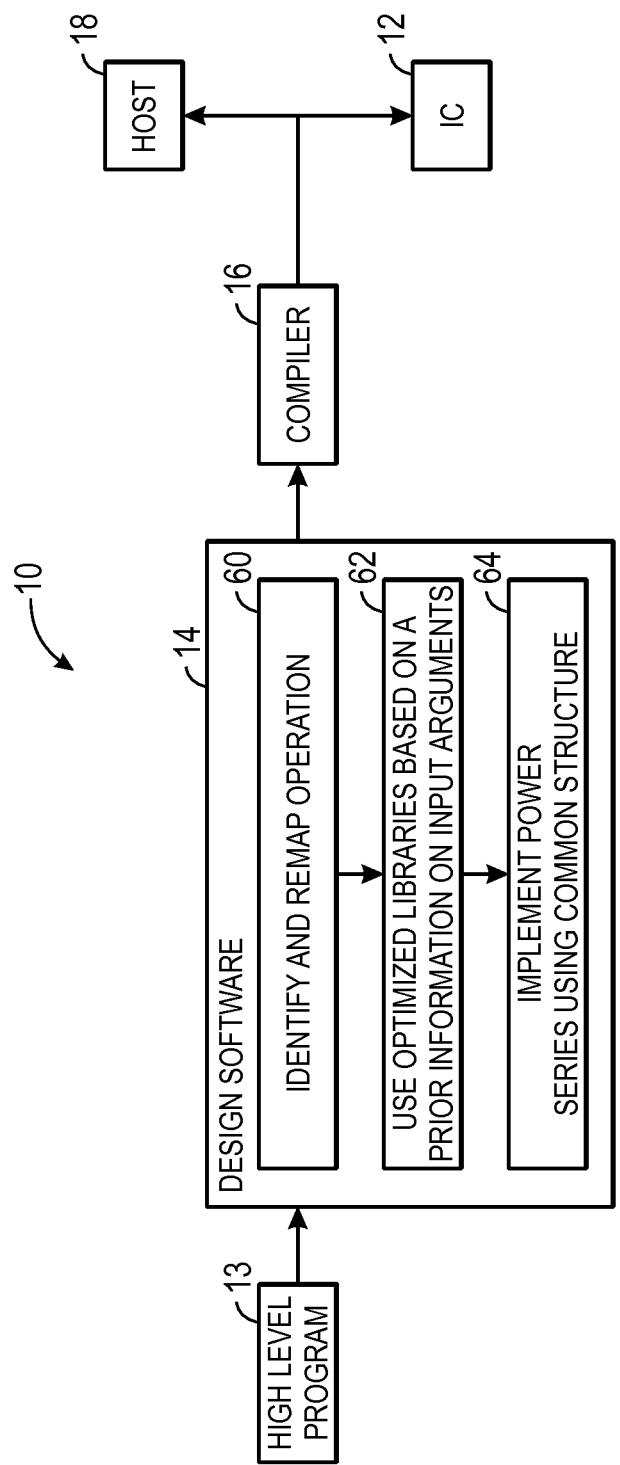
FIG. 3 is a block diagram illustrating the generation of the enhanced fixed-point and/or floating-point operations in the system of FIG. 1, in accordance with an embodiment.

Referring now to FIG. 3, a block diagram illustrating the system 10, further details functionalities of the design software 14 of FIG. 1. As previously discussed, the high level program 13 may be implemented in the design software 14. The design software 14 may determine that fixed-point and/or floating-point operations are present in the high level program 13 and may make efficient use of IC resources by generating fixed-point and/or floating-point operations with shared components. For example, in some embodiments, the design software 14 may identify and remap operations to share some sub-functions (block 60). Further, in some embodiments, the design software may use optimized libraries based on a priori information on the input arguments of a program (block 62). Additionally, in some embodiments, the design software may implement a shared power series using a common structure (block 64) to decrease the area of programmable elements 50 needed to implement the fixed-point and/or floating-point operations. The compiler 16 may then provide machine-readable instructions representative of the high level program with space-saving fixed-point and/or floating-point operations to the host 18 and the IC 12.

Figure 4:
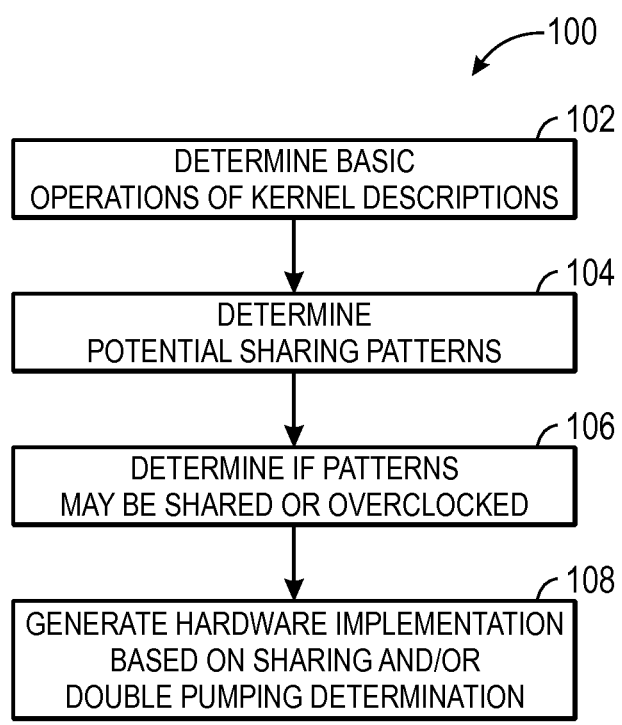
FIG. 4 is a flowchart depicting a process for sharing sub-functions of fixed-point and/or floating-point operations, in accordance with an embodiment.

Turning now to a more detailed discussion of creating enhanced fixed-point and/or floating-point operations, FIG. 4 illustrates a process 100 for implementing these enhanced fixed-point and/or floating-point operations through identifying and remapping operations (block 60 of FIG. 3). The process 100 begins with determining basic operations of a kernel description (block 102). For example, a data flow graph that represents the fixed-point and/or floating-point computations may be generated and each complex fixed-point and/or floating-point operation may be broken down into basic operations. Next, potential sharing patterns will be determined (block 104). For example, an analysis to find patterns (e.g., sub-portions of the fixed-point and/or floating-point operations that are similar), their functionalities, and their positions in the data flow graph may be used to determine potential sharing candidates. After analyzing for the patterns, the patterns are analyzed to determine whether they can be shared or overclocked (block 106). When a simple function of the pattern is only used once per clock cycle, the simple function may be shared. However, when the simple function is used more than once, overclocking may be used to enable sharing of multiple functions on a single clock cycle. For example, if patterns can be shared because they will not be called at the same time (e.g., in an if-then-else scenario), the sub-portions will be merged, reducing the number of logical elements needed to implement the fixed-point and/or floating-point operations. When patterns cannot be shared, the system may determine whether overclocking of these functions (e.g., enabling the processing of multiple requests in a single clock cycle) may be possible. If so, such functionality may similarly reduce the logical element area 50 needed to implement the design, by enabling overclocked sharing of the simple functions in the patterns. Once the shareable and overclocking patterns have been determined, the system may generate a hardware implementation (block 108), which may be instantiated inside of an Open CL kernel.

Routing the patterns to use the shared functions and/or the overclocked shared functions can be expensive, especially considering the wide data paths utilized in digital signal processing. In some embodiments, it may be beneficial to identify and share a small number of larger sub-functions over a larger number of small sub-functions. Accordingly, in an effort to increase cost savings in the design, design software may attempt to detect and share larger sharing patterns over smaller sharing patterns. As the design software determines potential sharing patterns (block 104), the design software may analyze tradeoffs between programmable logic (e.g., logical element) savings and routing savings. For example, the more a sharing pattern is utilized, the more programmable logic space that may be saved, because the shared pattern does not have to be replicated in the programmable logic for each use of the sharing pattern. However, another consideration may be the routing costs to route functions to these sharing patterns. As mentioned above, routing costs may be potentially very high, especially with expansive data paths. Accordingly, larger sharing patterns may reduce routing costs more than smaller sharing patterns. For example, for very small sharing patterns, the routing costs from the function to the small sharing pattern may outweigh the programmable logic savings. However, with larger sharing patterns, the programmable logic savings may outweigh the routing costs. Thus, the design software may implement cost optimization algorithms that select sharing patterns from the potential sharing candidates. These optimizations may be based upon balancing tradeoffs between programmable logic savings and routing costs using the frequency (or potential frequency) of use of the potential sharing candidates and/or the size of the potential sharing candidates. In some embodiments, the sharing patterns may be selected based upon a non-balanced approach.

For example, routing savings may be preferred over programmable logic savings or vice-versa.

In some scenarios, some classes of functions may be made up, at least partially, of other functions of similar complexity. For example, computer-implemented mathematical declarations (e.g., a math.h header file) may define mathematical functions using other mathematical definitions in the computer-implemented declarations. Some commonly grouped functions (e.g., trigonometric functions) use a common set of functions found in the computer-implemented declarations and/or functions of simple complexity. In some instances, entire sub-functions may be shared among complex functions. For example, equations 1-5 below illustrate some possible decompositions of elementary and trigonometric functions through identities. As illustrated by these decompositions, division and inverse square root operations may be common across multiple functions in a given applications. Division and inverse square root operations, which may be resource intensive and have a long latency, may consume a large percentage of many of the functions. By sharing these operations between multiple different functions in a data path (e.g., by sharing at a higher mathematical declaration level, such as a at the math.h header level as opposed to a lower functional level), significant resource savings may be achieved. By sharing operations at higher levels of functionality, based upon determined commonality of these operations at the higher levels, a decreased number of these operations may be implemented. In one embodiment, an algorithm may denote that these operations are shared at higher levels of functionality, and thus, further optimization regarding these shared operations may be avoided. For example, a data flow diagram describing the application may be annotated to stop further optimization based upon higher-level sharing of operations.

$$\exp(a+b+c) = \exp(a)\exp(b)\exp(c) \quad (1)$$

$$\arctan(a) = \arctan(b) + \arctan\left(\frac{a-b}{1+ab}\right) \quad (2)$$

$$\tan(a+b) = \frac{\tan(a) + \tan(b)}{1 - \tan(a) * \tan(b)} \quad (3)$$

$$\arccos = 2\arctan\left(\frac{\sqrt{1-x^2}}{1+x}\right) \quad (4)$$

$$\arccos = 2\arctan\left(\frac{1-x}{\sqrt{1-x^2}}\right) \quad (5)$$

Further, as fixed-point and/or floating-point representation is used, additional common functions may be found. For example, an inverse square root can implement a square root (as illustrated in equation 6) or division (as illustrated in equation 7).

$$\sqrt{x} = \frac{x}{\sqrt{x}} \quad (6)$$

$$\frac{x}{y} = \frac{x}{\sqrt{y^2}} \quad (7)$$

In some embodiments, analysis at this level of an equation may be too complex or process-intensive. Accordingly, it may be beneficial to design functions (e.g., stand alone operations, like tangent or inverse square root) differently to make the analysis easier. For example, these functions may be designed for ease of combining with other functions by designing them to have sharable patterns. These specially designed functions may be larger, slower, and/or have a longer latency because their purpose is to create patterns over efficiency and/or precision. In some embodiments, two versions of each function may be created, one that introduces shareable patterns and another that streamlines efficiency. The proper version may be selected based upon a determined goal. For example, the shareable pattern version may be used when conservation of programmable area is prioritized over operating efficiency and the streamlined efficiency version may be used when performance is more important than programmable area conservation. The determined goal may be provided by a designer and/or may be discerned by a computer (e.g., a computer running the design software). For example, a user may manually input that speed is more important than programmable area conservation or the design software may analyze characteristics of the design (e.g., programmable area utilization, etc.) to determine the goal. The design software may be forward-looking, predicting potential future modifications of the design, such that such predictions may be accounted for in determining the goal. For example, the design software may predict that a programmable area occupied by the design will increase by 40% in the near future. Based upon this prediction, the design software may determine that programmable area conservation is the desired goal.

Figure 5:
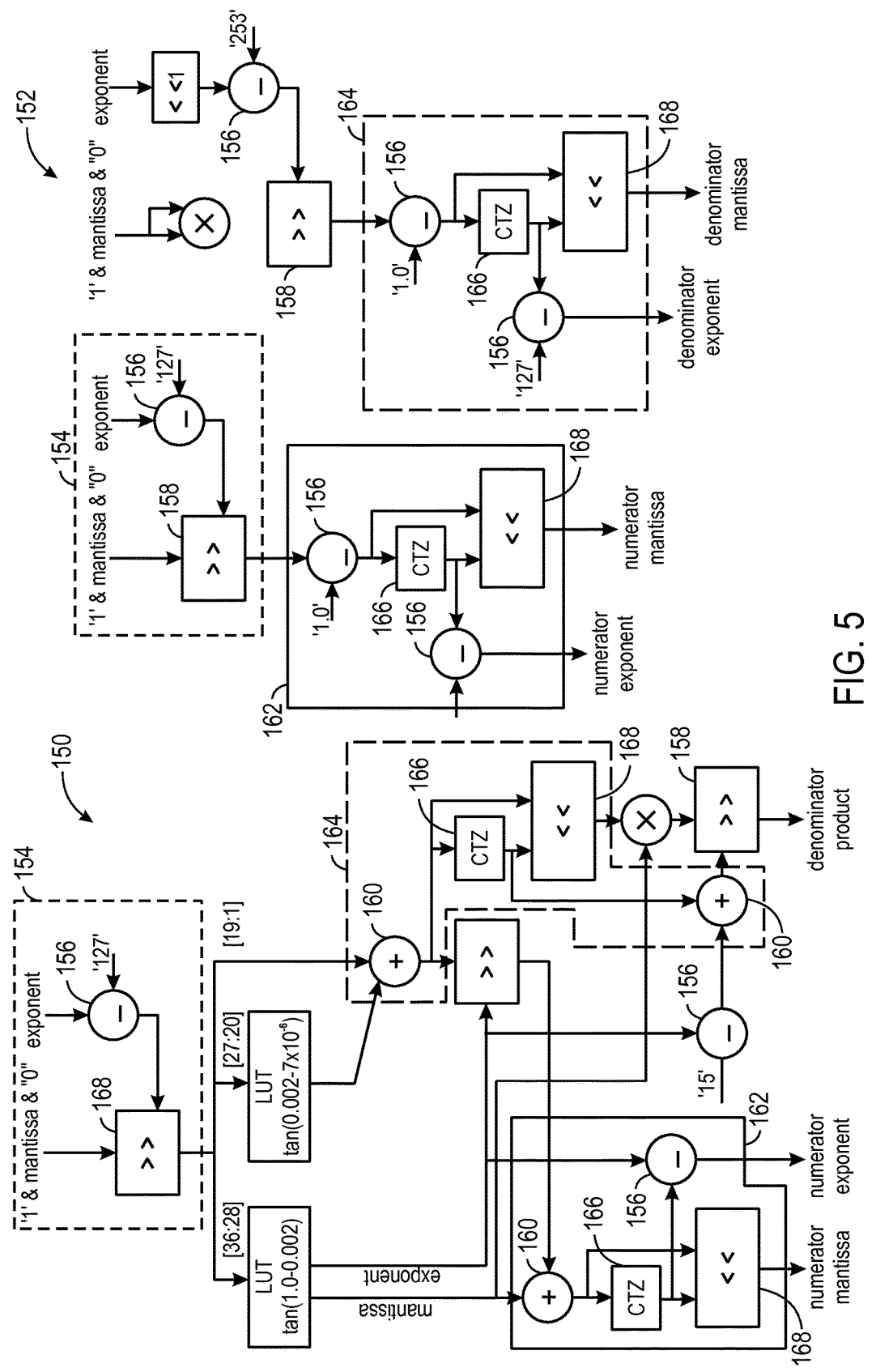
FIG. 5 is a block diagram illustrating an example implementation of the process of FIG. 4.

As discussed in block 104 of FIG. 4, through analysis by a computer (e.g., a computer running the design software), patterns may be observed between circuit designs of various functions. FIG. 5 is block diagram illustrating tangent function preparation logic 150 and sine/cosine preparation logic 152 where patterns may be observed. The computer may also determine if these patterns may be shared to conserve programmable logic. For example, in the provided example, the computer may determine that both the tangent preparation logic 150 and the sine/cosine preparation logic 152 include a subtract-and-shift pattern 154 (e.g., an identically ordered set of subtract 156 and right shift 158 operations).

Additionally, more complex patterns may also be determined. For example, the computer may realize a relationship between two operations (e.g., addition 160 and subtraction 156 operations) and extend pattern recognition based upon this relationship. Accordingly, in the provided example, the computer may recognize a pattern 162 and a pattern 164, despite some of the operations (e.g., the addition 160 and subtraction 156 operations) not being the same. For example, because the computer has realized that the subtraction 156 and addition 160 operators are related, the computer may determine that a pattern exists when the only difference in the pattern is a subtraction 156 operation being used instead of an addition 160 operation. Accordingly, because the pattern 162 includes an addition 160 operation or a subtraction 156 operation attached to a count leading zeros 166 operation, which is tied to a left shift operation 168 and a subtraction operation 156, the computer may detect the pattern 162.

The pattern 164 may be determined in a similar fashion. Because an addition 160 operation or a subtraction 156 operation is attached to a count leading zeros 168 operation and a left shift 168 operation and the count leading zeros 168 operation is tied to an addition 160 operation or a subtraction 156 operation, the computer may determine that the pattern 164 exists. Once again the pattern 164 exists despite a difference in subtraction 156 and addition 160 operations, because the computer has detected a relationship in implementation associated with these operations.

Once the patterns (e.g., patterns 154, 162, and 164) are determined, the computer may then analyze the host program to determine whether the patterns may be shared when implemented. The computer may determine that the patterns may be shared if they will only be invoked by one function at a time. For example, when if-then-else logic is used to call the tangent preparation logic 150 in one case or else the sine/cosine preparation logic 152, the computer may determine that the patterns will not be called by both the tangent preparation logic 150 and the sine/cosine preparation logic 152 at the same time. Because the calls to these logic components are mutually exclusive, the patterns 154, 162, and 164 may be shared. The following is a simple example of a program where mutually exclusive calls may enable the computer to determine that pattern sharing may be implemented:

_kernel void example( . . . ) {
. . .
  If (a)
  Z=tan(x);
  Else
  Z=cos(y);
. . .
}

When the patterns cannot be shared, for example, because the calls to the logic components are not mutually exclusive, the computer may determine if overclocking of the patterns may be implemented. Overclocking may allow the operations within the patterns to process two or more requests in a single clock cycle. Accordingly, a process from the tangent preparation logic 150 and a process from the sine/cosine preparation logic 152 could both be handled by one implementation of the patterns. Thus, by implementing only one overclocked pattern, similar programmable logic area efficiencies may be obtained.

Once the computer (e.g., through instructions of the design software) determines the patterns that may be shared or overclocked, the computer may implement the hardware on the IC based upon this determination. Accordingly, the hardware may be instantiated within an OpenCL kernel and may require less programmable logic than traditional hardware implementations, resulting in significant resource savings.

Figure 6:
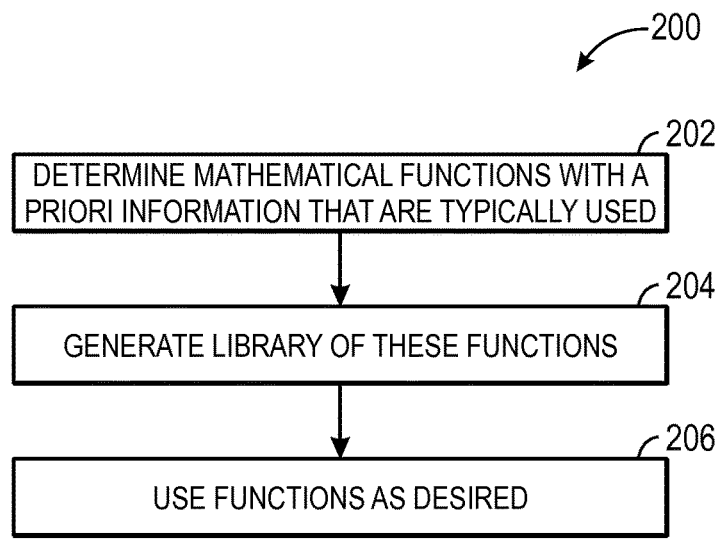
FIG. 6 is a flowchart illustrating a process for generating a shared sub-function library, in accordance with an embodiment.

In some embodiments, libraries may generated for specific operations that are commonly implemented as part of functions in logic of the IC. Many functions used in fixed-point and/or floating-point operations include operations with similar input arguments. For example floating-point addition with '1.0' and floating-point subtraction from '1.0' are both common operations in function decomposition. Accordingly, a library with these operations may be generated, enabling sharing among fixed-point and/or floating-point operations and ultimately reducing the programmable logic area required to implement these functions. FIG. 6 illustrates a process 200 for generating a shared library for sub-functions of an operation. The process 200 begins with determining mathematical functions with a priori input information that are typically used in fixed-point and/or floating-point operations (block 202). For example, as discussed above, addition with '1.0' and subtraction from '1.0' are both common functions with a priori input information that are commonly used. Next, a computer (e.g., a computer running design software) may generate a library of these functions (block 204). Once the library is generated, a host, the IC, or the computer running the design software may use the sub-functions described by the generated library (block 206).

Figure 7:
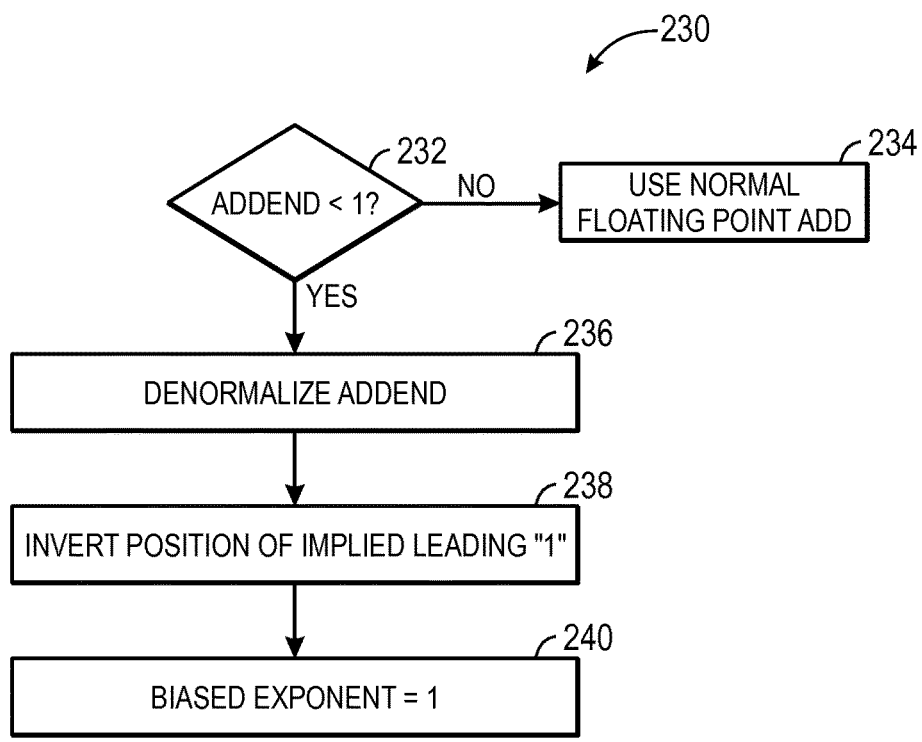
FIG. 7 is an illustration of an optimized process for floating-point addition with 1.0 that may be implemented in a shared sub-function library, in accordance with an embodiment.

FIG. 7 illustrates a sub-function 230 for floating-point addition with '1.0' that may be implemented in the sharing library. The sub-function 230 begins by determining whether an addend is less than one (decision block 232). If the addend is greater than or equal to one, normal floating-point addition logic is used (block 234). However, simplified logic may be used when the addend is less than 1. Under the simplified logic, the addend may be denormalized (block 236). Further, the position of the original implied leading '1' is inverted (block 238). No normalization is needed and the biased exponent is set to '1' (e.g., 127 for single precision and 1023 for double precision).

Figure 8:
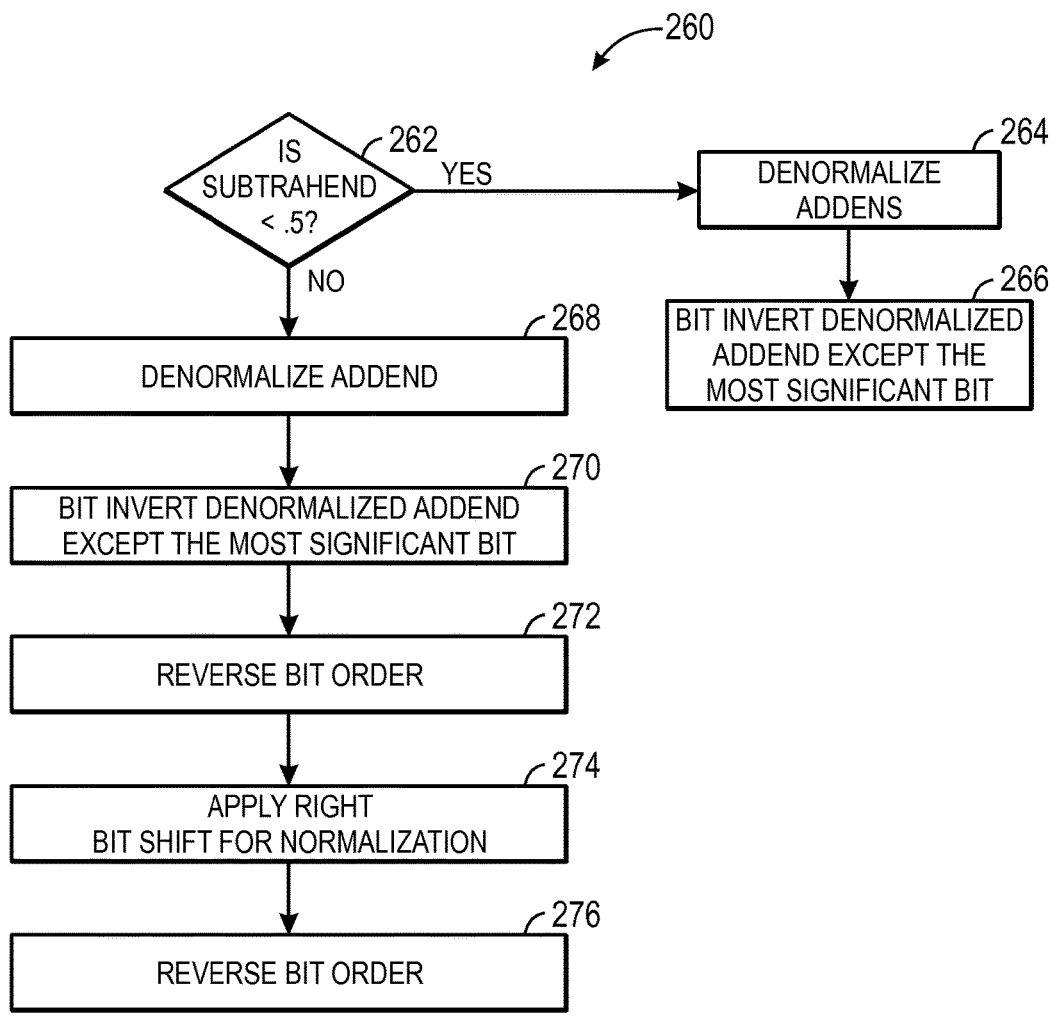
FIG. 8 is an illustration of an optimized process for floating-point subtraction with 1.0 that may be implemented in a shared sub-function library, in accordance with an embodiment.

FIG. 8 illustrates a sub-function 260 for floating-point subtraction from '1.0' that may be implemented in the sharing library. When the subtrahend is greater than 0.5, it may be possible to perform this operation without a fixed point subtraction operation. Accordingly, the sub-function 260 begins by determining whether a subtrahend is less than 0.5 (decision block 262). If the subtrahend is less than 0.5, the addend is denormalized (block 264). The entire denormalized addend is bit inverted except for the most significant bit (MSB) (block 264). This has the effect of subtracting the 1's complement of the subtrahend. The addition of a '1' into the least significant bit (LSB) of the number is optional, but may be desired when the destination is a floating-point function with a fixed point operator core that operates on a precision greater than the current floating-point mantissa size (block 266). In any case, no mantissa normalization is required because there will always be a 1 bit shift to the left for this sub-function 260.

When the subtrahend is greater than 0.5, a special near/far path structure may be implemented. This structure will be described by example. Taking a 24 bit ('1'+23 bit mantissa) value close to one, the number is denormalized (block 268). For example, after 1 bit denormalization, the number might look like:
0111 1111 1110 0010 1010 1001.
Then, the denormalized value is bit inverted except for the most significant bit (block 270). For example, subtracted from '1.0' in a one's compliment format, this is:
0000 0000 0001 1101 0101 0110.
The bit order is then reversed (block 272). This may occur without requiring processing by re-ordering wires. The reversed bits may be represented by:
0110 1010 1011 1000 0000 0000.
A right bit shift is then applied for normalization (block 274). The amount of the shift by counting the leading zeros on the denormalized value that is subtracted from '1.0' in a one's compliment format. For example, in the provided example, an 11 bit shift is needed for normalization. Next, the bit order is reversed again (block 276), providing a result of:
110 1010 1011 0000 0000 0000.

The shared sub-function library may enable operational implementations that are more efficient, by, for instance, reducing the number of operations that need to be implemented on the IC. For example, in the subtraction sub-function 260, a left bit shift operation is removed by reversing the bit order and completing a right bit shift. Accordingly, the shared sub-function library may increase the amount of logic that may be implemented on the IC.

An additional area of efficiency may be found by sharing series functions. The method described herein may result in a smaller number of look up tables, resulting in a reduced about of programmable logic area required to implement the design. Most functions can be decomposed by range reduction. Two or more subranges may be calculated and then combined using an identity. One or more of the subranges may be taken from a look up table, which includes exact values. One or more of the subranges may be calculated with an approximation. The approximation subranges may have an error, but the magnitude of this error will be below the least significant bit (LSB). Accordingly the final result will be accurate to the floating-point representation that is used.

One way of approximating a sub-range is through use of a power series. Horner's rule details a method for optimizing a power series calculation. The optimization discussed herein may be applied to both direct power series calculations and/or Horner's rule methods.

A power series may be described as:

$$y = a_0 + a_1 x + a_2 x^2 + a_3 x^3 + a_4 x^4 + \ldots \quad (6), \text{ or}$$

$$y = \sum_{i=0}^{\infty} a_i x^i \quad (7)$$

The coefficients ($a_i$ values) may be positive, negative, or zero.

To obtain an accurate result, floating-point arithmetic may be typically used. However, this may be very expensive in terms of logic and digital signal processing (DSP) blocks because of the number of adders and multipliers needed for these calculations. Further, a number of terms (usually 3-4) are required for an accurate approximation. Using Horner's rule, both the number of additions and multiplications is one each per term.

As discussed in U.S. patent application Ser. No. 13/234,419, entitled Computing Floating-Point Polynomials In an Integrated Circuit Device, which is herein incorporated by reference, floating-point calculations can be reduced to the complexity of fixed point calculations. To implement these efficiencies, each term in a power series may have a bank of numbers associated with it. The bank of numbers may include shifted versions of the coefficient for that term. As the exponent of the value of the argument of the series changes, the relative value of any term in the series changes with a power of two to any other term. This may be coded by selecting a shifted version of the same coefficient at any term, based on the exponent. The mantissa of the argument has the same relative effect for all terms. Accordingly, it does not have to be accounted for separately.

Accordingly, as the x value will be less than 1 (usually considerably so), all the higher power terms may be much smaller than the preceding terms, so no swapping of terms is required for floating-point addition. Right shifts can be eliminated as well. The amount of right shift of any term relative to any other term is purely dependant on the exponent of x, and as the coefficients are multiplied with the power by a DSP Block, each individual coefficient can be replaced by a bank of coefficients (e.g., each value shifted to the right by the number of bits equivalent to the difference in power to the previous term in the series—usually 1, but sometimes 2 or more), which are indexed by the exponent of the argument.

Not all series have the same number of terms. For example, some power series may have only even powers, some may have odd powers, and some may have constant values. The efficiencies discussed above can be expanded to support all power terms required by any approximation.

Each bank of coefficients at each power term may contain multiple sub-banks. The sub-bank is selected by the function approximated. The coefficient index in each sub-bank is selected by the exponent of the argument. Some sub-banks may contain only zeros. For example, when the current approximation uses only odd powers, the sub-bank at the even power for the approximation will contain only zeros. Additionally, if, for example, there are four terms in the shared series structure, and there are six functions, there will be four memories, each containing six banks of shifted coefficients. The number of coefficients depends on the power of the term, the maximum exponent of x, and the LSB position of the desired representation.

In one example, assume the maximum exponent is −8 (for 2E-8) and double precision arithmetic representation is used (LSB 2E-52). For an x3 position at least 20 shifted versions of the coefficients are needed. This is because x3 must be represented to at least 52 bits below x, or 2E-60. It will take 60/3=20 coefficients to do this. Therefore the size of the memory for the x3 term will be 120 (6 functions*20 terms), but for each of addressing coefficient tables would be stored on 32 bit boundaries, giving a total memory size of 192 locations. Higher power terms will require smaller memories. Accordingly, the memory size may still be much less than what is needed to implement floating-point operators.

The cost of implementing the coefficient banks for this efficiency is relatively low. Compared to digital signal processing (DSP), the memory used to implement these efficiencies may be relatively inexpensive. Further, since fewer terms are used for the higher powers, it is likely that the same embedded memory contain a bank for one approximation could easily support multiple copies.

Through shared sub-function optimization, sharing sub-function operators, and/or sharing series functions among fixed-point and/or floating-point operations, the implementation of these operations may be greatly optimized. For example, the amount of programmable logic needed to implement these functions may be greatly reduced, enabling increased flexibility in programmable logic designs for an IC.

While the embodiments set forth in the present disclosure may be susceptible to various modifications and alternative forms, specific embodiments have been shown by way of example in the drawings and have been described in detail herein. However, it should be understood that the disclosure is not intended to be limited to the particular forms disclosed. The disclosure is to cover all modifications, equivalents, and alternatives falling within the spirit and scope of the disclosure as defined by the following appended claims.

What is claimed is:

1. A computer-implemented method, comprising:
reducing an amount of programmable logic needed to implement instructions on programmable logic of an integrated circuit (IC) by:
identifying and mapping one or more operationally shareable sub-functions of two or more fixed-point operations, floating-point operations, or a combination thereof, by:
processing a kernel description to obtain a representation of the two or more fixed-point operations, floating-point operations, or the combination thereof;
analyzing the representation for patterns between the two or more fixed-point operations, floating-point operations, or the combination thereof;
wherein the operationally sharable sub-functions comprise a common sub-portion of components between the two or more fixed-point operations, floating-point operations, or combination thereof; and mapping the one or more operationally shareable sub-functions to the two or more fixed-point operations, floating-point operations, or combination thereof, such that the operationally shareable sub-functions are shared between the two or more fixed-point operations, floating-point operations, or the combination thereof, by:

determining whether the patterns may be shared based upon mutually exclusive calls of the two or more fixed-point operations, floating-point operations, or the combination thereof;

determining whether the patterns may be overclocked when the patterns may not be shared; and implementing a shared overclocked pattern for the two or more fixed-point operations, floating-point operations, or the combination thereof, when the patterns may be overclocked.

2. The method of claim 1, comprising:
designing at least one of the fixed-point operations, the floating-point operations, or any combination thereof, with a shareable sub-function that may be used by multiple fixed-point operations, floating-point operations, or any combination thereof.

3. The method of claim 1, comprising:
determining whether efficiency of the fixed-point operations and floating-point operations or conservation of programmable logic of the IC is more important;
implementing a first version of at least one of the fixed-point operations or floating-point operations for efficiency when the efficiency is more important; and
implementing a second version of the at least one of the fixed-point operations or floating-point operations designed for sharing sub-functions when the conservation is more important.

4. A computer-implemented method of claim 1, comprising:
reducing an amount of programmable logic needed to implement instructions on programmable logic of an integrated circuit (IC) by:
implementing a set of fixed-point operations, floating-point operations, or a combination thereof via a sub-library that comprises one or more sub-operations that are typically found in fixed-point operations, floating-point operations, or a combination thereof;
wherein the one or more sub-operations comprise floating-point addition with 1.0, floating-point subtraction from 1.0, or both;
wherein the floating-point addition with 1.0 comprises:
determining whether an addend is less than 1;
if the addend is not less than 1, using a standard floating-point addition operation;
if the addend is less than 1, denormalizing the addend; and
inverting a position of an implied leading 1 of the denormalized addend; or
wherein when the one or more sub-operations comprise floating-point addition with 1.0, the floating-point addition with 1.0 comprises:
determining whether an addend is less than 1;
if the addend is not less than 1, using a standard floating-point addition operation;
if the addend is less than 1, denormalizing the addend; and
inverting a position of an implied leading 1 of the denormalized addend; or
both.

5. The method of claim 4, comprising:
generating the sub-library and implementing the fixed-point operations, the floating-point operations, or the combination thereof via the sub-library; wherein generating the sub-library comprises determining mathematical functions with a priori information regarding inputs that are typically used in the mathematical functions and implementing the functions with the inputs in a library.

6. A computer-implemented method, comprising:
reducing an amount of programmable logic needed to implement instructions on programmable logic of an integrated circuit (IC) by:
identifying one or more operationally shareable sub-functions of two or more fixed-point operations, floating-point operations, or a combination thereof, the operationally sharable sub-functions comprising a common sub-portion of components between the two or more fixed-point operations, floating-point operations, or combination thereof;
mapping the one or more operationally shareable sub-functions to the two or more fixed-point operations, floating-point operations, or combination thereof, such that the operationally shareable sub-functions are shared between the two or more fixed-point operations, floating-point operations, or the combination thereof;
implementing a second set of fixed-point operations, floating-point operations, or a combination thereof via a sub-library that comprises one or more sub-operations that are typically found in the fixed-point operations, the floating-point operations, or the combination thereof;
implementing a power series problem via a structured first bank of coefficients configured to hold multiple second banks of coefficients; wherein the first bank is selected by a function index of the power series problem and the second bank is selected by an exponent of the power series problem; or
any combination thereof; and
implementing the floating-point operations by:
decomposing functions into sub-ranges by range reduction;
calculating the sub-ranges; and
combining the sub-ranges using an identity;
wherein at least one of the sub-ranges is calculated using Horner's rule based upon the first bank of coefficients configured to hold the multiple second banks of coefficients; wherein the first bank is selected by a function index of the power series problem and the second bank is selected by an exponent of the power series problem.

7. An integrated circuit (IC) device comprising:
internal memory configured to store a kernel program; and
the kernel program stored in the internal memory, comprising complex fixed-point operations, complex floating-point operations, or a combination thereof that comprise one or more sub-operations;
wherein the one or more sub-operations comprise a common pattern of components between the complex fixed-point operations, complex floating-point operations, or combination thereof;
wherein when the common pattern cannot be shared based upon mutually exclusive calls between two or more complex fixed-point operations, complex floating-point operations, or combination thereof, but can be overclocked, the sub-operations are operationally overclocked for use in the two or more complex fixed-point operations, complex floating-point operations, or combination thereof; and wherein when the one or more of the one or more sub-operations are operationally shareable based upon the mutually exclusive calls between the two or more complex fixed-point operations, complex floating-point operations, or combination thereof, the one or more sub-operations are operationally shared between the mutually exclusive calls between the two or more complex fixed-point operations, complex floating-point operations, or combination thereof, to conserve an amount of the internal memory needed to store the complex fixed-point operations, the complex floating-point operations, or the combination thereof.

8. The IC device of claim 7, wherein the sub-operations comprise a pattern of identical operations in two or more of the complex fixed-point operations, the complex floating-point operations, or the combination thereof.

9. The IC device of claim 8, wherein the shared operations comprise at least one of addition with 1.0 or subtraction from 1.0.

10. The IC device of claim 7, wherein the sub-operations comprise a pattern of operations in two or more of the complex fixed-point operations, the complex floating-point operations, or the combination thereof, wherein the pattern of operations may account for a relationship between two or more operations, the relationship representing that the two or more operations may be implemented in a similar manner.

11. The IC device of claim 7, wherein the sub-operations comprise one or more shared operations sourced from a sharing library, the shared operations defining functions with typical inputs that are often used in the complex fixed-point operations, the complex floating-point operations, or the combination thereof.

12. A tangible, non-transitory, computer-readable medium, comprising instructions to:
accept a high level program comprising functionality for implementation on an integrated circuit (IC);
determine and cause implementation of a kernel implementation for the IC, wherein the kernel implementation comprises two or more fixed-point operations, floating-point operations, or a combination thereof with at least one operationally shared sub-operation to conserve an amount of internal memory needed to implement the fixed-point operations, the floating-point operations, or the combination thereof, by:
determining whether the sub-operation can be shared when invocations of the fixed-point operations, the floating point operations, or combination thereof are not mutually exclusive;
when the sub-operation can be shared when the invocations are not mutually exclusive, share the sub-operation between the invocations;
when the sub-operation cannot be shared when the invocations are not mutually exclusive:
determine whether the sub-operation can be overclocked when the sub-operation cannot be shared; and
implement the sub-operation for two of the fixed-point operations, floating-point operations, or a combination thereof using an overclocked sub-operation when the sub-operation can be overclocked;
wherein the at least one shared sub-operation comprises a common sub-portion of components between the two or more fixed-point operations, floating-point operations, or combination thereof.

13. The computer-readable medium of claim 12, comprising instructions to:
determine a priority in a tradeoff between execution efficiency and internal memory conservation;
supply a first kernel implementation with a first version of at least one of the fixed-point operations, the floating-point operations, or a combination thereof, configured to enhance execution efficiency when the priority is execution efficiency; and
supplying a second kernel implementation with a second version of at least one of the fixed-point operations, the floating-point operations, or a combination thereof, configured to enhance conservation of internal memory when the priority is to conserve the amount of internal memory.

14. The computer-readable medium of claim 12, comprising instructions to:
determine that the sub-operation can be shared when invocations of the two or more fixed-point operations, floating-point operations, or the combination thereof are mutually exclusive; and
determine that the sub-operation cannot be shared when the invocations are not mutually exclusive.

15. The computer-readable medium of claim 12, comprising instructions to:
obtain the sub-function from a sub-function library configured to store a plurality of sub-functions that are commonly used in fixed-point operations, floating-point operations, or a combination thereof.

16. The computer-readable medium of claim 15, comprising instruction to:
obtain the sub-function from the sub-function library; wherein the sub-function comprises addition with 1.0 or subtraction with 1.0.

17. The computer-readable medium of claim 12, comprising instructions to:
select the at least one shared sub-operation from a plurality of shareable sub-operations based upon an analysis of tradeoffs between programmable logic savings and routing savings.

18. A tangible, non-transitory, computer-readable medium, comprising instructions to:
accept a high level program comprising functionality for implementation on an integrated circuit (IC);
determine and cause implementation of a kernel implementation for the IC, wherein the kernel implementation comprises two or more fixed-point operations, floating-point operations, or a combination thereof with at least one operationally shared sub-operation to conserve an amount of internal memory needed to implement the fixed-point operations, the floating-point operations, or the combination thereof;
decompose at least one of the fixed-point operations, floating-point operations, or a combination thereof into sub-ranges by range reduction;
calculate the sub-ranges; and
combine the sub-ranges using an identity;
wherein the at least one shared sub-operation comprises a common sub-portion of components between the two or more fixed-point operations, floating-point operations, or combination thereof; and
wherein the sub-operation comprises a calculation of at least one of the sub-ranges based upon Horner's rule using a first bank of coefficients configured to hold multiple second banks of coefficients; wherein the first bank is selected by a function index of a power series problem and the second bank is selected by an exponent of the power series problem.

* * * * *